United States Patent
Grebennikov et al.

(10) Patent No.: US 10,432,147 B2
(45) Date of Patent: Oct. 1, 2019

(54) INVERTED THREE-STAGE DOHERTY AMPLIFIER

(71) Applicant: SUMITOMO ELECTRIC DEVICE INNOVATIONS, INC., Yokohama-shi, Kanagawa (JP)

(72) Inventors: Andrey Grebennikov, Herts (GB); James Wong, Surrey (GB); Naoki Watanabe, London (GB)

(73) Assignee: SUMITOMO ELECTRIC DEVICE INNOVATIONS, INC., Kanagawa (JP)

( * ) Notice: Subject to any disclaimer, the term of this patent is extended or adjusted under 35 U.S.C. 154(b) by 0 days.

(21) Appl. No.: 15/909,394

(22) Filed: Mar. 1, 2018

(65) Prior Publication Data
US 2018/0254748 A1 Sep. 6, 2018

Related U.S. Application Data

(63) Continuation-in-part of application No. 15/827,541, filed on Nov. 30, 2017, now Pat. No. 10,187,015.
(Continued)

(51) Int. Cl.
| | |
|---|---|
| *H03F 3/68* | (2006.01) |
| *H03F 1/02* | (2006.01) |
| *H03F 1/32* | (2006.01) |
| *H03F 3/60* | (2006.01) |
| *H03F 1/56* | (2006.01) |
| *H03F 3/24* | (2006.01) |

(52) U.S. Cl.
CPC ......... *H03F 1/0288* (2013.01); *H03F 1/0294* (2013.01); *H03F 1/3205* (2013.01); *H03F 1/3223* (2013.01); *H03F 1/3241* (2013.01); *H03F 1/56* (2013.01); *H03F 3/24* (2013.01); *H03F 3/245* (2013.01); *H03F 3/604* (2013.01); *H03F 3/607* (2013.01); *H03F 2200/408* (2013.01); *H03F 2200/451* (2013.01)

(58) Field of Classification Search
CPC ............. H03F 1/0288; H03F 1/07; H03F 3/68
USPC ............................................... 330/124 R, 295
See application file for complete search history.

(56) References Cited

U.S. PATENT DOCUMENTS

| | | | |
|---|---|---|---|
| 6,737,922 B2 | 5/2004 | Pengelly et al. | |
| 9,667,199 B1 * | 5/2017 | McLaren | .............. H03F 1/0288 |

(Continued)

FOREIGN PATENT DOCUMENTS

EP 2403135 1/2012

OTHER PUBLICATIONS

Office Action per Ex Parte Quayle in co-pending U.S. Appl. No. 15/909,477 dated Mar. 15, 2019.

*Primary Examiner* — Steven J Mottola
(74) *Attorney, Agent, or Firm* — Smith, Gambrell & Russell, LLP

(57) ABSTRACT

An inverted three-stage Doherty amplifier is disclosed. The amplifier provides an input power divider, a carrier amplifier, two peak amplifiers, and an output combiner. The output combiner includes five quarter-wavelength ($\lambda/4$) lines, three of which correspond to the three amplifiers, one of which combines an output of the carrier amplifier with an output of the first peak amplifier, and the last of which combines the combined output of the carrier amplifier and the first peak amplifier with an output of the second peak amplifier. The five $\lambda/4$ lines have respective impedances to optionally adjust the output impedance of the respective amplifiers.

5 Claims, 5 Drawing Sheets

Related U.S. Application Data

(60) Provisional application No. 62/465,502, filed on Mar. 1, 2017.

(56) References Cited

U.S. PATENT DOCUMENTS

| | | |
|---|---|---|
| 2008/0284509 A1 | 11/2008 | Kim et al. |
| 2013/0154731 A1 | 6/2013 | Gajadharsing |
| 2013/0265107 A1 | 10/2013 | Holmes |
| 2016/0248383 A1 | 8/2016 | Otake |
| 2018/0034419 A1 | 2/2018 | Moronval |

\* cited by examiner

INVERTED THREE-STAGE DOHERTY AMPLIFIER

CROSS REFERENCE TO RELATED APPLICATIONS

This patent application is a continuation-in-part of pending prior U.S. patent application Ser. No. 15/827,541, filed on Nov. 30, 2017, now U.S. Pat. No. 10,189,015, which claims a benefit of U.S. Provisional Patent Application Ser. No. 62/427,931, filed Nov. 30, 2016. The present application claims a priority under 35 U.S.C. § 119 of U.S. Provisional Application Ser. No. 62/465,502 filed on Mar. 1, 2017, all of which are incorporated herein by reference.

BACKGROUND OF INVENTION

1. Field of Invention

The present invention relates to a Doherty amplifier.

2. Background

In most communication systems, it is required that the power amplifier could operate with high efficiency and high linearity simultaneously. However, there is a tradeoff between the efficiency and the linearity with improvement in one of the two coming at the expense of the other of the two. Besides, many wireless communications systems, such as GSM (Global System Mobile Communication)/EDGE (Enhanced Data Rates for GSM Evolution), CDMA2000 (Code Division Multiple Access 2000), or WCDMA (Wideband Code Division Multiple Access)/LTE (Long Term in Evolution), or the like, require that the power amplifier could deliver a wide range of output power. As a result, being designed for the highest power level with maximum available efficiency, the power amplifiers in base stations tend to operate less efficiently at lower power levels consuming a lot of extra DC power. Therefore, it is a real challenge to design a power amplifier applicable to a base station that has high efficiency not only at maximum output power but also at lower power levels typically ranging from −6 dB and less, with minimum size and lower cost of implementation.

SUMMARY OF INVENTION

An aspect of the present invention relates to a three-stage inverted Doherty amplifier that includes, an input power divider, a carrier amplifier, first and second peak amplifiers to be turned on in this order, and an output combiner. The input power divider receives an input signal and outputs three divided signals. One of the three divided signals has a phase delayed by $\pi/2$ from phases of rest of the three divided signals. The carrier amplifier, which includes an offset transmission line, receives one of the three divided signals with no phase delay. The first peak amplifier, which also includes an offset transmission line, receives one of the three divided signals with no phase delay. The second peak amplifier receives the one of the three divided signals delayed by $\pi/2$. The offset transmission lines in the carrier amplifier and the first and second peak amplifiers convert output impedance thereof to be short-circuits when the carrier amplifier and the first and second peak amplifiers are turned off. The output combiner combines the outputs of the carrier amplifier and the first and second peak amplifiers; and includes first to fifth quarter-wavelength lines.

The first to third quarter-wavelength lines correspond to the carrier amplifier and the first and second peak amplifiers, respectively. The fourth quarter-wavelength line combines the output of the carrier amplifier provided through the first quarter-wavelength line with the output of the first peek amplifier provided through the second quarter-wavelength line. The fifth quarter-wavelength line combines the combined outputs of the carrier amplifier and the first peak amplifier provided through the fourth quarter-wavelength line with the output of the second peak amplifier provided through the third quarter-wavelength line; and outputs thus combined outputs of the carrier amplifier and the first and second peak amplifiers. A feature of the three-stage inverted Doherty amplifier of the present invention is that the first peak amplifier has a size greater than a size of the carrier amplifier; and the second peak amplifier has size greater than the size of the first peak amplifier.

DESCRIPTION OF EMBODIMENTS

Next, some embodiments according to the present invention will be described as referring to accompanying drawings. In the description of the drawings, numerals or symbols same with or similar to each other will refer to elements same with or similar to each other without duplicating explanations.

Figure 1:
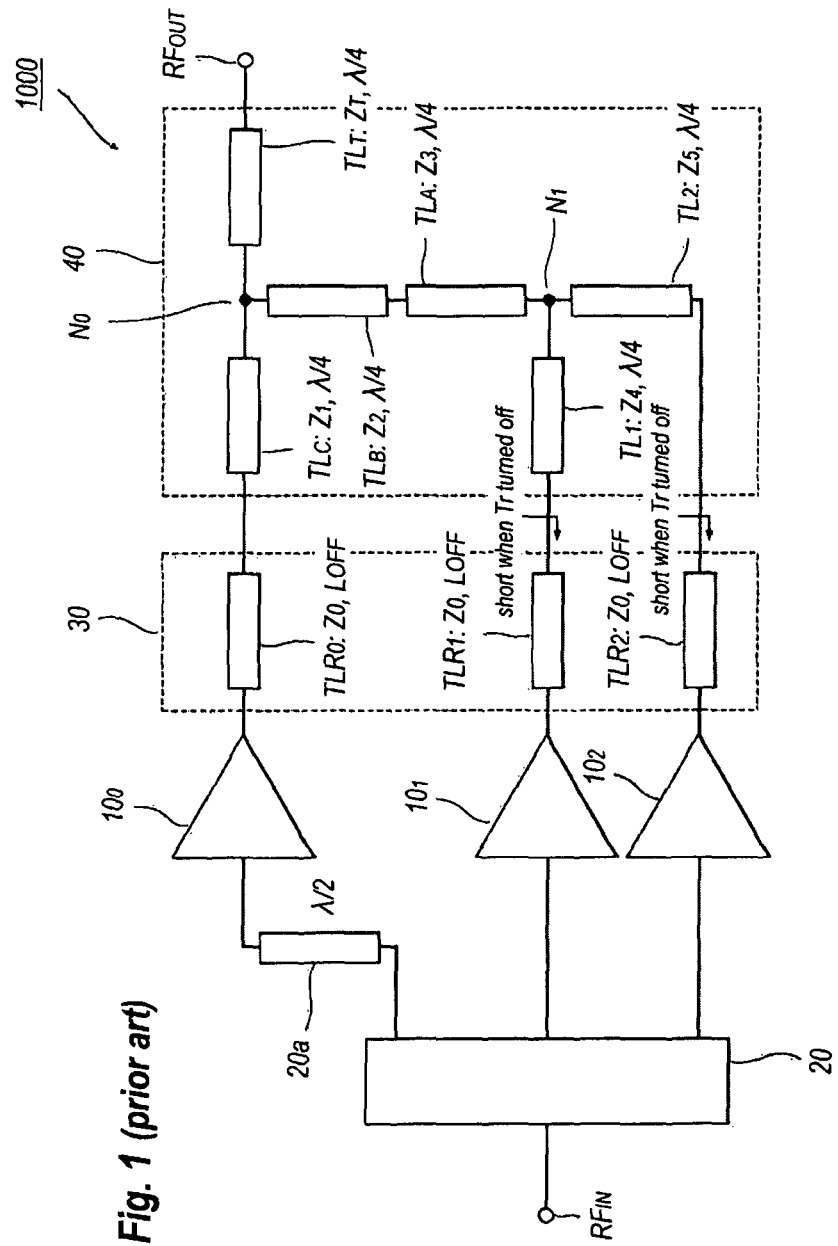
FIG. 1 shows a functional block diagram of a conventional three-stage inverted Doherty amplifier.

FIG. 1 shows a functional block diagram of a three-stage modified inverted Doherty amplifier 1000 with a conventionally known configuration, where the quarter wavelength ($\lambda/4$) lines are added in the outputs of the carrier amplifier $10_0$ and the peak amplifiers, $10_1$ and $10_2$, to provide a proper load modulation ratio. In inverted Doherty architectures, in view of the presence of parasitic capacitance due to a shunt drain-source, inductance attributed to a series bonding wire and a package lead, a design to set the output of the amplifiers to be a short circuit becomes easier compared with a design to set the output impedance to be an open circuit when the amplifiers are turned off in a low power region. In this case, the shunt capacitor and series inductor compose the series resonant circuit with the series resonance frequency close to the carrier frequency. By using an additional series offset line in an offset unit 30; the resonant point may be properly tuned to the carrier frequency.

Figure 5A:
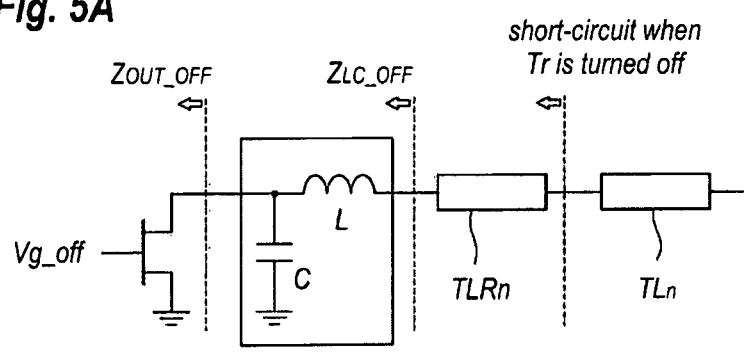
FIG. 5A schematically shows a circuit diagram of an offset unit for a carrier amplifier and also a peak amplifier.
Figure 5B:
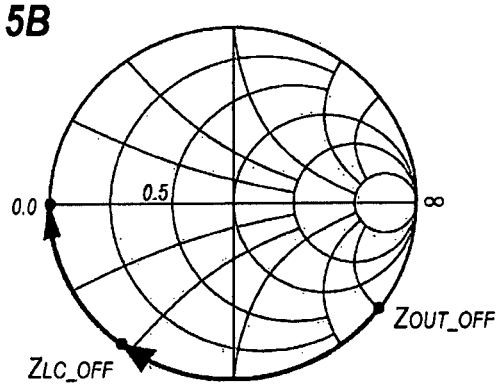
FIG. 5B shows an impedance behavior of the offset unit shown in FIG. 5A.

Explaining further specifically, FIG. 5A schematically illustrates a primary portion of a circuit diagram around an FET implemented within the amplifiers, $10_0$ to $10_3$, while, FIG. 5B indicates a smith chart of the circuit shown in FIG. 5A. The FET in the amplifier inevitably accompanies with the junction capacitance between the drain and the source, and the inductance due to the bonding wire to extract an output from the drain. Assuming the output impedance of the FET seeing the inside at the drain thereof to be $Z_{OUT\_OFF}$, this impedance $Z_{OUT\_OFF}$ shifts from the open circuit ∞ on the smith chart as shown in FIG. 5B.

Referring to FIG. 5A, the FET in the drain thereof couples with a matching circuit including, for instance, a capacitor C and an inductor L, where the capacitor C is not the junction capacitance between the drain and the source of the FET but the inductor L corresponding to the inductance attributed to the bonding wire connected between the drain of the FET and the offset transmission line $TLR_n$. The matching circuit moves, or rotates clockwise from the $Z_{OUT\_OFF}$ to the $Z_{LC\_OFF}$, that is, the impedance $Z_{LC\_OFF}$ corresponds to impedance seeing the FET at the end of the offset transmission line $TLR_n$.

The offset transmission lines, $TLR_0$ to $TLR_2$, in the offset unit 30 have the electrical length corresponding to rotate the point $Z_{LC\_OFF}$ to the short circuit (Z=0). Because the point $Z_{LC\_OFF}$ positions in the edge on the smith chart, the offset transmission lines, $TLR_0$ to $TLR_2$, have the characteristic impedance of $Z_0$, and the electrical length $L_{OFF}$ so as to rotate the point from the point $Z_{LC\_OFF}$ to the short circuit (Z=0) in the left end, where an example shown in FIG. 5B has the electrical length about $\lambda/16$.

Referring back to FIG. 1, in the description below, CA means a carrier amplifier; while, PA means a peak amplifier. All amplifiers, the CA and the PAs, are turned on at saturation, the CA is turned on only to provide a maximum efficiency at a maximum back-off point, and both CA and the $PA_1$ are turned on, with $PA_2$ being turned off, to provide intermediate efficiency. The half-wavelength line 20a in the input path of the CA $10_0$ is used to compensate for the delay provided by the output combiner 40.

Figure 2:
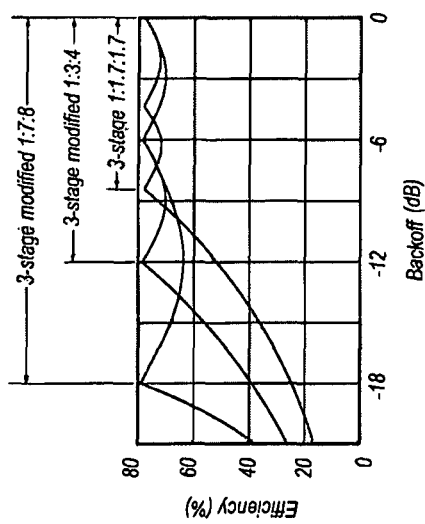
FIG. 2 compares behaviors of efficiencies of the Doherty amplifier of the embodiments with that of the conventional Doherty amplifier.

In the circuit arrangement shown in FIG. 1, setting a ratio of device sizes to be 1:1.7:1.7 for the respective amplifiers, $10_0$ to $10_2$; the first peak efficiency is obtained at a back-off point of −4.2 dB where the CA $10_0$ and the first PA $10_1$ are turned on, and the maximum efficiency at the back-off point is provided to be −8.5 dB where only the CA $10_0$ is turned on, as shown in FIG. 2. However, the output combiner 40 includes six quarter-wavelength lines, $TL_1$, $TL_2$, $TL_A$, $TL_B$, $TL_C$, and $TL_T$, which makes the final implementation inconvenient in terms of a size and a cost of a Doherty amplifier. Besides, the back-off point that provides the maximum efficiency is not fallen down enough to provide high efficiency for modern LTE signals that request considerably high peak-to-average power ratio (PAR) of, for instance 9 dB or higher.

Figure 3:
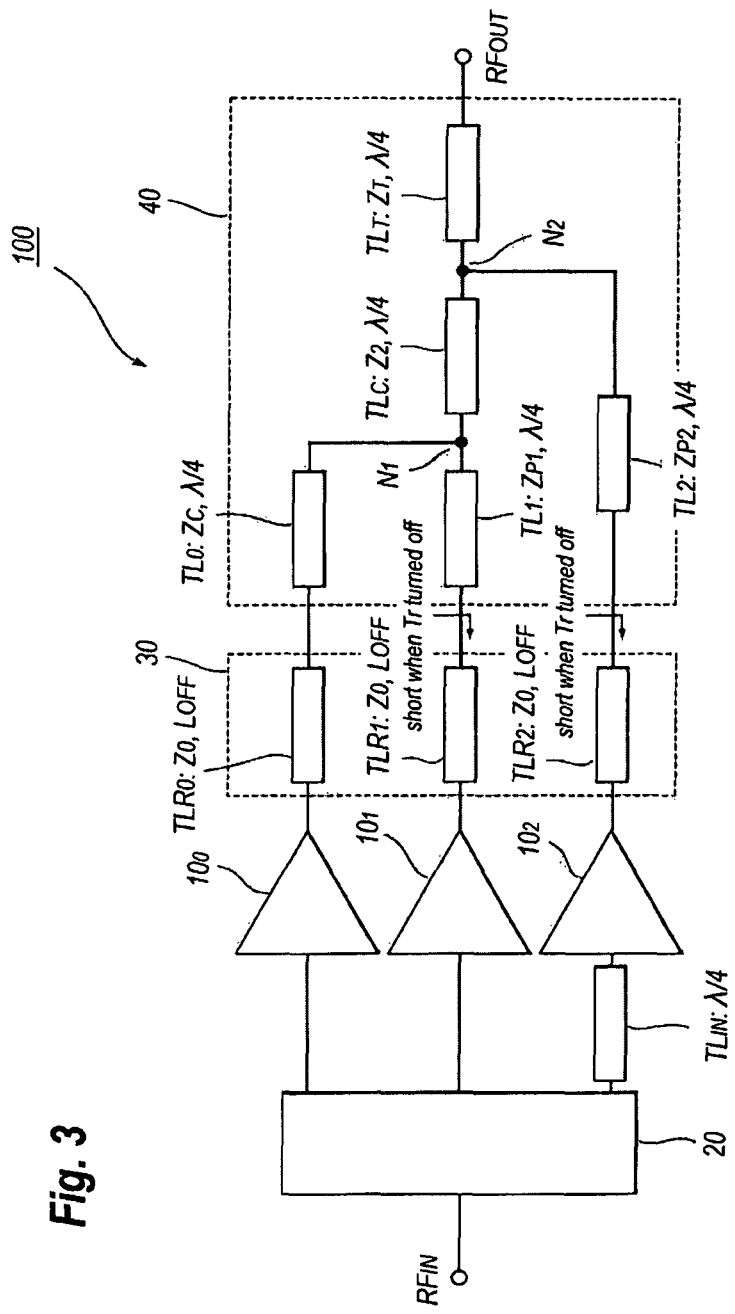
FIG. 3 shows a functional block diagram of a three-stage inverted Doherty amplifier according to an embodiment of the present invention.

FIG. 3 shows a functional block diagram of an inverted Doherty amplifier 100 according to an embodiment of the present invention that includes a CA $10_0$, two PAs, $10_1$ and $10_2$, an input power divider 20, an offset unit 30, and an output combiner 40. The CA $10_0$ and the two PAs, $10_1$ and $10_2$, each implementing an input matching circuit and an output matching circuit therein, are configured to operate such that the PAs, $10_1$ and $10_2$, switch on sequentially in this order as increasing the input power. The input power divider 10 is coupled between an input terminal $RF_{IN}$ and respective inputs of the CA $10_0$ and the two PAs, $10_1$ and $10_2$; the outputs of the CA $10_0$ and the two PAs, $10_1$ and $10_2$, are coupled through an output combiner 40 to an output terminal $RF_{OUT}$. The second PA $10_2$ is coupled with the input power divider 20 through a transmission line $TL_{IN}$ with a quarter-wavelength for a signal subject to the Doherty amplifier 100.

The CA $10_0$ and the first PA $10_1$ are coupled with the first common node $N_1$ through respective offset lines, $TLR_0$ and $TLR_1$, and impedance converters, $TL_0$ and $TL_{P1}$, which also includes an additional impedance converter $T_C$ connected in series to the first common node $N_1$, where those paths and elements including the CA $10_0$ and the first PA $10_1$ constitute the first path of the present invention. The second path includes the second PA $10_2$, an offset line $TLR_2$ and another impedance converter $TL_{P2}$. Both the first path and the second path are combined at the second common node $N_2$. That is, the other impedance converter $TL_{P2}$ in the second path is connected with the second common node $N_2$, and becomes an open circuit when the second PA $10_2$ is turned off because impedance viewing the second PA $10_2$ at an end of the offset line $TLR_2$ becomes a short circuit. Impedance of the transmission lines in the output combiner 40 are chosen so as to provide power combination when the CA $10_0$ and the two PAs, $10_1$ and $10_2$, are turned on. The quarter-wavelength line $TL_T$ connected between the second common node $N_2$ and the output terminal $RF_{OUT}$ provides the output impedance transformation.

The inverted three-stage Doherty amplifier shown in FIG. 3 has an extended back-off with sufficient efficiency. Here, the arrangement includes only one quarter-wavelength line $TL_{IN}$ between the input power divider 20 and the input of the second PA $10_2$ in addition to five (5) quarter-wavelength lines in the output combiner 40, which may optionally set the back-off point providing the maximum efficiency by adequately selecting the device size of the CA $10_0$ and characteristic impedance $Z_C$ of the quarter-wavelength line $TL_0$.

Specifically, when the devices in the CA $10_0$ and the PAs, $10_1$ and $10_2$, in sizes thereof have a ratio of $1:m_1:m_2$, the impedance, $Z_C$ and $Z_{P1}$, of the transmission lines, $TL_0$ and $TL_1$, are preferably set to be:

$$Z_C = Z_0 * (1 + m_2/m_1), \text{ and}$$

$$Z_{P1} = Z_0 * (1 + m_1/m_2),$$

where $Z_0$ is load impedance of the Doherty amplifier 100.

When both PAs, $10_1$ and $10_2$, are turned off, the CA $10_0$ sees the load impedance of $(1+m_2/m_1)^2/2$ to provide a back-off point where the efficiency becomes a maximum because a ratio in impedance of the transmission lines, $TL_T$ and $T_C$, is set to be $Z_T/Z_C=\sqrt{2}$. For example, assuming a ratio of the device sizes to be 1:3:4, the back-off point, at which a maximum efficiency is given, becomes −12 dB. In another example, when the devices have a ratio of 1:7:8 in sizes thereof, the back-off point may expand to −18 dB, as shown in FIG. 2.

When the CA $10_0$ and the first PA $10_1$ are turned on but the second PA $10_2$ is turned off, the former two amplifiers, $10_0$ and $10_1$, behave as an un-balanced Doherty amplifier. Besides, when the ratio in the device sizes in the two amplifiers, $10_0$ and $10_1$ is set to be 1:3, the back-off range becomes −6 dB, while, the ratio of 1:7 brings the back-off range of −12 dB. When the CA $10_0$ and the two PAs, $10_1$ and $10_2$, are all turned on, a composite amplifier of the CA $10_0$ with the first PA $10_1$, and the second PA $10_2$ may behave as a balanced Doherty amplifier to show an additional back-off range of −6 dB because a sum of the device sizes for the CA $10_0$ and the first PA $10_1$ becomes equal to the size the second PA $10_2$ in the examples above described. Accordingly, the former example where the ratio of the device sizes is 1:3:4 shows the back-off range of −6 dB −6 dB=−12 dB, while, the latter example of the ratio of 1:7:8 gives the back-off range of −12 dB −6 dB=−18 dB.

All amplifiers include the input matching circuits, whose configurations fully depend on the corresponding device impedance for particular applications to match the source with the impedance of 50 Ω. The offset lines, $TLR_0$ to $TLR_2$, are necessary to provide low impedance at the outputs thereof when the PAs, $10_1$ and $10_2$ are turned off. All amplifiers, $10_0$ to $10_2$, are turned on at the saturation, the CA $10_0$ is turned on only to provide efficiency peak at maximum back-off when the first and second PAs, $10_1$ and $10_2$, are turned off, and both CA $10_0$ and the first PA $10_1$ are turned on to operate as an un-balanced Doherty amplifier and provide an efficiency peak at inter mediate efficiency peak. In this case, the output matching circuit of CA $10_0$ in conjunction with the corresponding quarter-wavelength line $TL_0$ connected in series thereto in the output combiner 40 should provide the impedance information when the high impedance is seen by the current source of the transistor CA.

Figure 4:
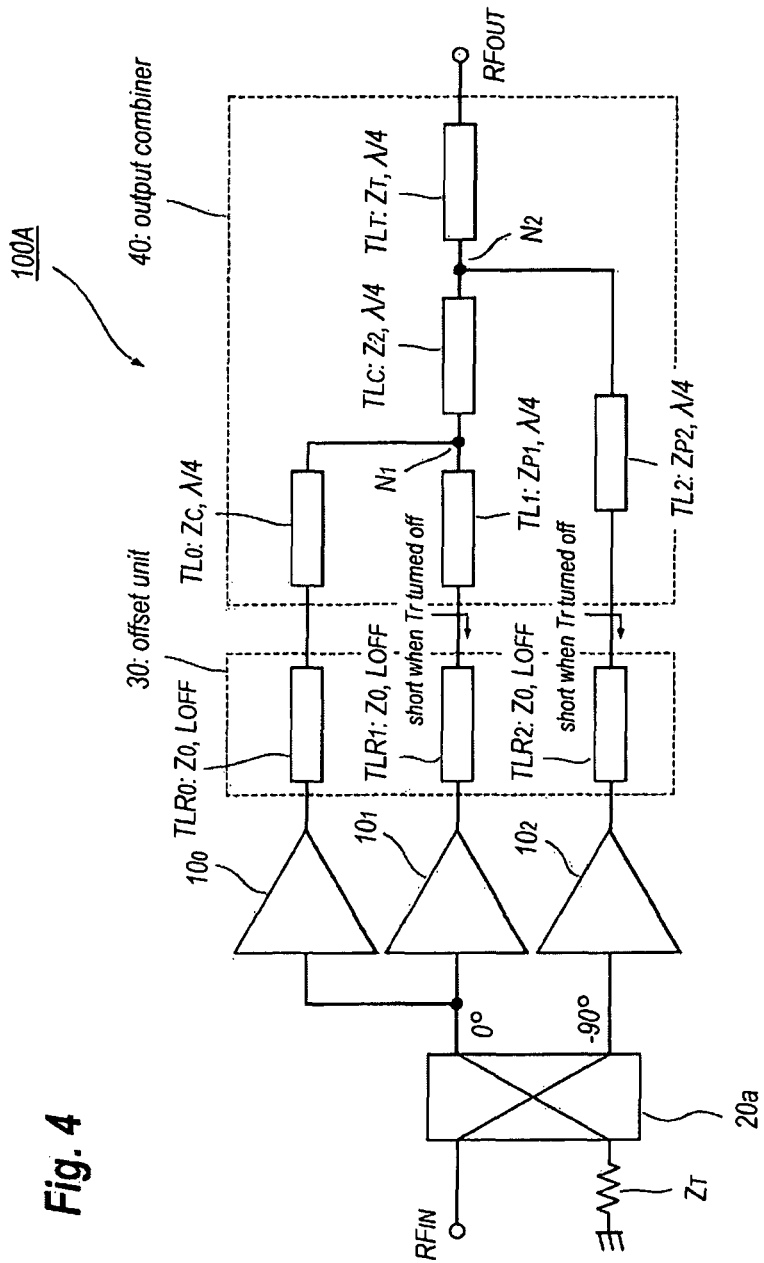
FIG. 4 shows a functional block diagram of a three-stage inverted Doherty amplifier according to another embodiment of the present invention.

FIG. 4 shows another embodiment of the modified inverted three-stage Doherty configuration with extended high-efficiency back-off point where the CA $10_0$ and the first PA $10_1$ are connected together to one output port of the 90° hybrid coupler 20a, while the second PA $10_2$ is connected to another output port of the input coupler 20a. In this case, an additional quarter wave transmission line $TL_{IN}$ at the input diving circuit becomes unnecessary.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. An inverted three-stage Doherty amplifier that outputs an amplified signal by receiving an input signal, comprising:
   an input power divider that receives the input signal and outputs three divided signals, where one of the three divided signals has a phase delayed by it $\pi/2$ from phases of the rest of the three divided signals;
   a carrier amplifier including an offset transmission line, the carrier amplifier receiving one of the rest of the three divided signals;
   first and second peak amplifiers each including offset transmission lines, the first peak amplifier receiving another of the rest of the three divided signals, the second peak amplifier receiving the one of the three divided signals, the offset transmission line in the carrier amplifier and the offset transmission lines in the first and second peak amplifiers converting output impedances thereof to be short-circuits when the carrier amplifier and the first and second peak amplifiers are turned off; and
   an output combiner that combines outputs of the carrier amplifier and the first and second peak amplifiers, the output combiner including,
      a first quarter-wavelength line connected with the carrier amplifier,
      a second quarter-wavelength line connected with the first peak amplifier,
      a third quarter-wavelength line connected with the second peak amplifier,
      a fourth quarter-wavelength line connected with the first quarter-wavelength line and the second quarter-wavelength line, the fourth quarter-wavelength line combining an output of the carrier amplifier provided through the first quarter-wavelength line with an output of the first peak amplifier provided through the second quarter-wavelength line, and
      a fifth quarter-wavelength line connected with the third quarter-wavelength line and the fourth quarter-wavelength line, the fifth quarter-wavelength line combining an output of the second peak amplifier provided through the third quarter-wavelength line with a combined output of the carrier amplifier and the first peak amplifier provided through the fourth quarter-wavelength line; and outputting a combined output of the carrier amplifier and the first and second peak amplifiers,
   wherein the first peak amplifier has a size greater than a size of the carrier amplifier; and
   wherein the second peak amplifier has a size greater than the size of the first peak amplifier.

2. The inverted three-stage Doherty amplifier according to claim 1,
   wherein the carrier amplifier and the first and second peaking amplifiers have a size ratio of 1:m1:m2, and
   wherein the fourth quarter-wavelength line and the fifth quarter-wavelength line have impedances of $(1+m_2/m_1)*Z_0$ and $(1+m_1/m_2)*Z_0$, respectively, where $Z_0$ is an impedance of a load for the inverted three-stage Doherty amplifier.

3. The inverted three-stage Doherty amplifier according to claim 2, wherein the fifth quarter-wavelength line and the fourth quarter-wavelength line have impedances in a ratio of $\sqrt{2}$.

4. The inverted three-stage Doherty amplifier according to claim 2, wherein the carrier amplifier and the first and second peak amplifiers in the respective sizes thereof satisfy a condition of $(1+m_1)=m_2$.

5. An inverted three-stage Doherty amplifier that outputs an amplified signal by receiving an input signal, comprising
   an input power divider that receives the input signal and output two divided signals, where one of the two divided signals has a phase delayed by $\pi/2$ from the phase of the other of the divided signals;
   carrier amplifier including an offset transmission line, the carrier amplifier receiving the other of the divided signal;
   first and second peak amplifiers each including offset transmission lines, the first peak amplifier receiving the other of the divided signals, the second peak amplifier receiving the one of the divided signal, the offset transmission line in the carrier amplifier and the offset transmission lines in the first and second peak amplifiers converting output impedances thereof to be short-circuits when the carrier amplifier and the first and second peak amplifiers are turned off; and
   an output combiner that combines outputs of the carrier amplifier and the first and second peak amplifiers, the output combiner including,
      a first quarter-wavelength line connected with the carrier amplifier,
      a second quarter-wavelength line connected with the first peak amplifier,
      a third quarter-wavelength line connected with the second peak amplifier,
      a fourth quarter wavelength line connected with the first quarter-wavelength line and the second quarter-wavelength line, the fourth quarter-wavelength line combining an output of the carrier amplifier provided through the first quarter-wavelength line with an output of the first peak amplifier provided through the second quarter-wavelength line, and
      fifth quarter-wavelength line connected with the third quarter-wavelength line and the fourth quarter-wavelength line, the fifth quarter wavelength line combining an output of the second peak amplifier provided through the third quarter-wavelength line with a combined output of the carrier amplifier and the first peak amplifier provided through the fourth quarter-wavelength line; and outputting a combined output of the carrier amplifier and the first and second peak amplifiers,
wherein the first peak amplifier has a size greater than a size of the carrier amplifier,
wherein the second peak amplifier as a size greater than the size of the first peak amplifier, and
wherein the input power divider includes a 90° hybrid coupler including a transmitter port and a coupled port, the carrier amplifier and the first peak amplifier receiving the another of the divided signals as output from the transmitter port, the second peak amplifier receiving the one of the divided signals as output from the coupled port.

* * * * *